US010312061B2

(12) United States Patent
Yang et al.

(10) Patent No.: US 10,312,061 B2
(45) Date of Patent: Jun. 4, 2019

(54) VACUUM APPARATUS FOR VACUUM TREATING SUBSTRATE

(71) Applicants: BOE TECHNOLOGY GROUP CO., LTD., Beijing (CN); BEIJING BOE DISPLAY TECHNOLOGY CO., LTD., Beijing (CN)

(72) Inventors: Haitao Yang, Beijing (CN); Yunyou Zheng, Beijing (CN); Chenglong Wu, Beijing (CN); Wei Li, Beijing (CN); Youngjin Song, Beijing (CN); Xin Li, Beijing (CN); Lin Feng, Beijing (CN); Jie Liu, Beijing (CN)

(73) Assignees: BOE TECHNOLOGY GROUP CO., LTD., Beijing (CN); BEIJING BOE DISPLAY TECHNOLOGY CO., LTD., Beijing (CN)

(*) Notice: Subject to any disclaimer, the term of this patent is extended or adjusted under 35 U.S.C. 154(b) by 1023 days.

(21) Appl. No.: 14/526,423

(22) Filed: Oct. 28, 2014

(65) Prior Publication Data
US 2015/0332896 A1 Nov. 19, 2015

(30) Foreign Application Priority Data
May 14, 2014 (CN) .......................... 2014 1 0203251

(51) Int. Cl.
*H01J 37/32* (2006.01)
*H01J 37/04* (2006.01)
(52) U.S. Cl.
CPC .. *H01J 37/32697* (2013.01); *H01J 37/32009* (2013.01); *H01J 37/32532* (2013.01); *H01J 2237/0041* (2013.01)
(58) Field of Classification Search
None
See application file for complete search history.

(56) References Cited

U.S. PATENT DOCUMENTS 5,382,311 A * 1/1995 Ishikawa ............. C23C 16/4586
118/723 E
6,125,025 A * 9/2000 Howald .............. H01L 21/6833
279/128

FOREIGN PATENT DOCUMENTS

CN 101226871 7/2008
CN 101504928 8/2009
(Continued)

OTHER PUBLICATIONS

JP2000188288A Matsuki English Machine Translation dated Jul. 2000. Accessed from ESPACENET. Oct. 3, 2017.*
(Continued)

*Primary Examiner* — Rakesh K Dhingra
*Assistant Examiner* — Laureen Chan
(74) *Attorney, Agent, or Firm* — Womble Bond Dickinson (US) LLP

(57) ABSTRACT

An embodiment of the present disclosure provides a vacuum apparatus, which relates to a display technical field. The vacuum apparatus can eliminate an electrostatic adsorption between a substrate and an electrode so as to avoid damages to the substrate. The vacuum apparatus includes: a vacuum cavity; a first electrode and a second electrode located inside the vacuum cavity and opposite to each other; and positioning structures for positioning the substrate. The substrate is located between the first electrode and the second electrode and is positioned closer to the first electrode or the second electrode. The vacuum apparatus further includes an electrostatic elimination device. The electrostatic elimination device can eliminate the electrostatic adsorption between the substrate and the first electrode and/or between the substrate and the second electrode by attracting charged particles to the surface of the substrate closer to a side of the first electrode and/or the surface of the substrate closer to a side
(Continued)

of the second electrode. The present disclosure also relates to manufacture method of the vacuum apparatus.

7 Claims, 3 Drawing Sheets

(56) References Cited

FOREIGN PATENT DOCUMENTS

| | | | |
|---|---|---|---|
| CN | 201828743 | | 5/2011 |
| CN | 202103035 | | 1/2012 |
| CN | 103472603 | | 12/2013 |
| JP | H0513556 | | 1/1993 |
| JP | 2000188288 A | * | 7/2000 |
| JP | 2010010477 A | * | 1/2010 |

OTHER PUBLICATIONS

JPH0513556A Kano English Machine Translation dated Jan. 1993. Accessed from ESPACENET. Oct. 3, 2017. (Year: 1993).*
JP2010010477 Makino et al. Jan. 2010. English Machine Translation Accessed from ESPACENET Mar. 15, 2018 (Year: 2010).*
Chinese Office Action with English Language Translation, dated Oct. 28, 2015, Chinese Application No. 201410203251.X, All Pages.
Chinese Office Action with English Language Translation, dated Feb. 19, 2016, Chinese Application No. 201410203251.X.

* cited by examiner

VACUUM APPARATUS FOR VACUUM TREATING SUBSTRATE

BACKGROUND OF THE DISCLOSURE

1. Field of the Disclosure

The present disclosure relates to display technical fields, in particular to a vacuum apparatus.

2. Description of the Prior Art

An electrostatic elimination structure employed in a traditional dry etching apparatus is to produce plasma at a front face of a substrate. The plasma flows to a back face of the substrate naturally in vacuum atmosphere to neutralize charges so that the electrostatic interaction can be eliminated.

Along with usage time of the electrode increasing, the electrode surface and the barrier layer surface gradually become smooth, causing a tight adsorption between the substrate and the electrode, so that plasma cannot normally come to the back face of the substrate to eliminate electrostatic interaction. In this way, when supporting pins are raising the substrate gradually, the substrate may be subject to electrostatic adsorption from electrode, and the cooperation of them might cause damages to the substrate.

SUMMARY OF THE DISCLOSURE

An embodiment of the present disclosure provides a vacuum apparatus which can eliminate electrostatic adsorption between a substrate and an electrode so as to avoid damages to the substrate.

In order to achieve the above object, an embodiment of the present disclosure employs the following technical solution:

a vacuum apparatus, which comprising: a vacuum cavity; a first electrode and a second electrode located inside the vacuum cavity and opposite to each other; a positioning structure for positioning the substrate between the first electrode and the second electrode; and an electrostatic elimination device. The substrate is positioned closer to the first electrode or the second electrode. The electrostatic elimination device can eliminate electrostatic adsorption between the substrate and first electrode and/or between the substrate and the second electrode by attracting charged particles to a surface of the substrate closer to a side of the first electrode and/or a surface of the substrate closer to a side of the second electrode.

Preferably, the first electrode and/or the second electrode are provided with a plurality of gas holes.

Optionally, the vacuum apparatus further comprise a gas conveying device which is in connection with the vacuum cavity. The gas conveying device conveys cooling gas at a constant pressure to the substrate through the gas holes. The cooling gas is inert gas.

Further optionally, the vacuum apparatus further comprises a detection device for detecting the pressure of the cooling gas.

Optionally, the electrostatic elimination device comprises a plasma discharging system and a plasma conveying system, wherein the electrostatic elimination device conveys plasma to the surface of the substrate closer to the side of the first electrode or the surface of the substrate closer to the side of the second electrode.

Further optionally, the plasma discharging system comprises an anode and a cathode for generating the plasma. The plasma conveying system comprises a vacuum pump and a conveying conduit.

Further, the anode is the first electrode and the cathode is the second electrode. First connecting port(s) and second connecting port(s) are provided between the plasma conveying system and the vacuum cavity. The first connecting port is used to lead plasma generated inside the vacuum cavity outside the vacuum cavity, and the second connecting port is used to convey plasma to the substrate through the gas holes.

Optionally, the first electrode is positioned at top of the vacuum cavity and the second electrode is positioned at the bottom of the vacuum cavity. The substrate is positioned above the second electrode and near the second electrode.

Further optionally, the positioning structure(s) is (are) supporting pin(s), the second electrode is provided with pin hole(s) matching the supporting pin(s).

Optionally, the vacuum apparatus further comprises a barrier layer disposed around the first electrode and/or the second electrode, the thickness of the barrier layer is larger than the thickness of the first electrode and/or the second electrode.

The vacuum apparatus provided by the embodiment of the present disclosure includes the vacuum cavity; the first electrode and the second electrode located inside the vacuum cavity and opposite to each other; the positioning structure for positioning the substrate between the first electrode and the second electrode; and an electrostatic elimination device. The substrate is positioned closer to the first electrode or the second electrode. The electrostatic elimination device can eliminate electrostatic adsorption between the substrate and first electrode and/or between the substrate and the second electrode by attracting charged particles to the surface of the substrate closer to the side of the first electrode and/or the surface of the substrate closer to the side of the second electrode.

On this basis, the charged particles can neutralize charges on the surface of the substrate, so that the electrostatic adsorption between the substrate and the first electrode and/or the second electrode can be eliminated. In this way, substrate damages caused by electrostatic adsorption can be avoided when the substrate is placed further from the first electrode and/or the second electrode.

BRIEF DESCRIPTION OF DRAWINGS

In order to illustrate embodiment of the present disclosure or technical solution in prior art clearly, the following will simply explain drawings used in the description of the embodiment of the disclosure or the prior art. Obviously, the drawings in the following description only illustrate some embodiments of the present disclosure. As to those skilled in the art, other drawings can be obtained base on these drawings without creative efforts.

DETAILED DESCRIPTION OF THE PRESENT DISCLOSURE

The technical solution in the embodiments of the present disclosure will be described in more detail in conjunction with the attached drawings in the embodiments of the present disclosure. Obviously, the described embodiments are only some of the embodiments of the present disclosure, nor all embodiments. Based on the embodiments of the present disclosure, all other embodiments obtained by those skilled in the art without creative work are within the protection scope of the present disclosure.

Figure 1:
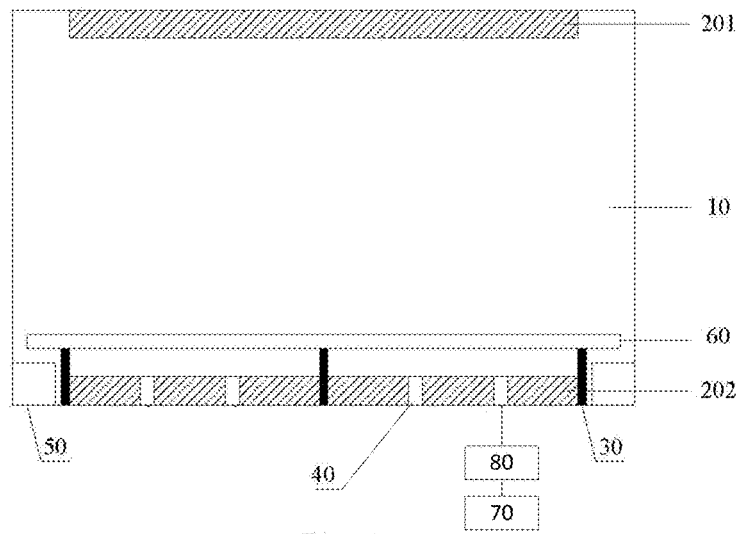
FIG. 1 is a first schematic view showing a structure of a vacuum apparatus provided by an embodiment of the present disclosure.
Figure 2:
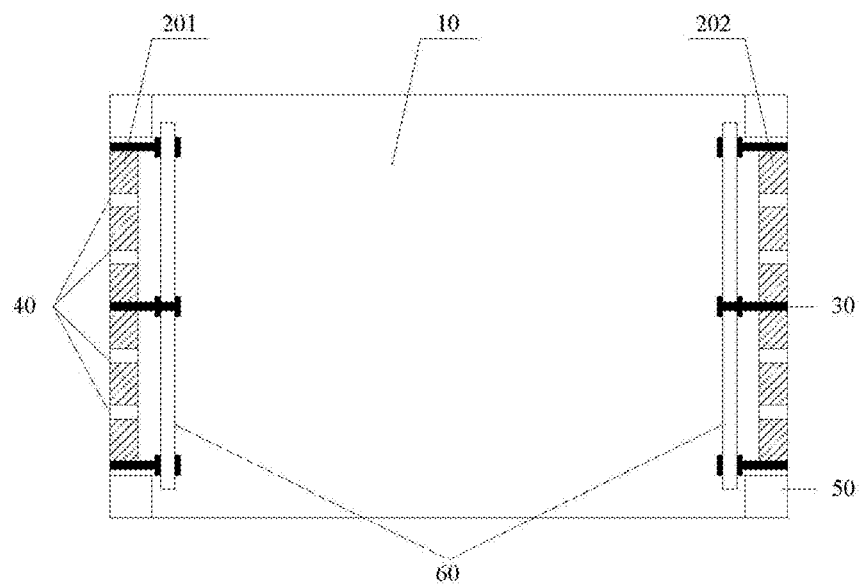
FIG. 2 is a second schematic view showing a structure of a vacuum apparatus provided by an embodiment of the present disclosure.
Figure 5:
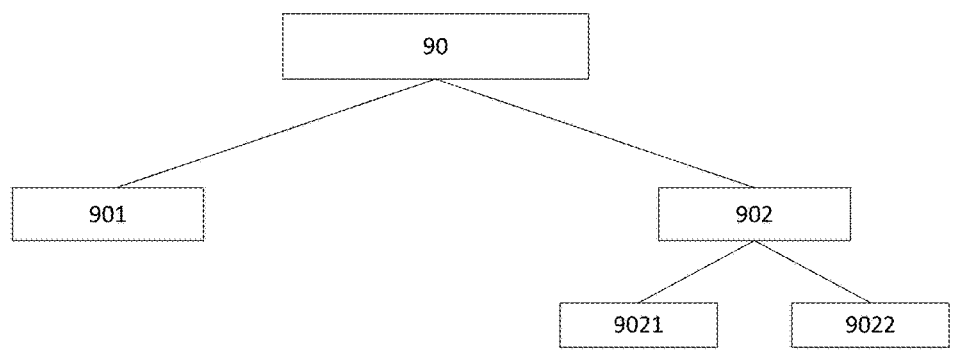
FIG. 5 is a schematic view showing components of an electrostatic elimination device.

The embodiment of the present disclosure provides a vacuum apparatus, as shown in FIG. 1, FIG. 2 and FIG. 5, which includes: a vacuum cavity 10; a first electrode 201 and a second electrode 202 located inside the vacuum cavity 10 and opposite to each other; and positioning structures 30 for positioning the substrate 60. The substrate 60 is located between the first electrode 201 and the second electrode 202 and is positioned closer to the first electrode 201 or the second electrode 202. The vacuum apparatus further includes an electrostatic elimination device 90 (shown in FIG. 5). The electrostatic elimination device 90 can eliminate electrostatic adsorption between the substrate 60 and the first electrode 201 and/or between the substrate 60 and the second electrode 202 by attracting charged particles to a surface of the substrate which is closer to a side the first electrode and/or a surface of the substrate which is closer to a side of the second electrode.

It should be noted that first, inside the vacuum cavity 10, the first electrode 201 and the second electrode 202 are positioned opposite to each other, in the following specific way: the first electrode 201 is disposed at the top of the vacuum cavity 10, the second electrode 202 is disposed at the bottom of the vacuum cavity 10, or alternatively the first electrode 201 and the second electrode 202 can be both disposed at the side wall(s) of the vacuum cavity 10, which is not limited herein.

Secondly, the positioning structures 30 can be used to adjust the position of the substrate 60 and secure the substrate 60. If the first electrode 201 and the second electrode 202 are disposed one above the other, one such substrate 60 can only be disposed over the lower electrode, in such case, the positioning structures 30 can be supporting pins. If the first electrode 201 and the second electrode 202 are disposed side by side, two such substrates 60 can be placed at the opposite sides of the two electrodes respectively. In such case, the positioning structures 30 can be clamps.

In an embodiment of the present disclosure, the number of the substrates 60 can be adjusted according to the specific positioning of the first electrode 201 and the second electrode 202. Of course, the securing method of the substrates 60 can be varied accordingly as the positioning way of the substrates 60 varies.

Thirdly, when the substrate 60 is positioned closer to the first electrode 201 or closer to the second electrode 202, a slight gap might be present between the substrate 60 and the first electrode 201 or between the substrate 60 and the second electrode 202. The presence of the gap can be advantageous to the flowing of the charged particles towards the surface of the substrate 60 so that charges can be neutralized.

Fourthly, the electrostatic elimination device 90 can attract the charged particles to the surface of the substrate 60 which is closer to a side of the first electrode 201 or the surface of the substrate 60 which is closer to side of the second electrode 202 in order to eliminate electrostatics. As to the electrostatic elimination device 90, it can include an additional charges-generating device which is located outside the vacuum cavity 10, or alternatively, charged particulates such as plasma generated inside the vacuum cavity 10 can be used as the charged particles, which will not be limited herein.

Fifthly, when the electrostatic elimination device 90 is used to eliminate charges on the surface of the substrate 60, if the charges on the substrate 60 are positive charges, the electrostatic elimination device 90 can introduce negative charged particles from negative charges gathering area; if the charges on the surface of the substrate 60 are negative charges, the electrostatic elimination device 90 can introduce positive charged particles from positive charges gathering area.

An embodiment of the present disclosure provides a vacuum apparatus. The vacuum apparatus includes a vacuum cavity 10; a first electrode 201 and a second electrode 202 located inside the vacuum cavity 10 and opposite to each other; and positioning structures 30 for positioning the substrate 60. The substrate 60 is located between the first electrode 201 and the second electrode 202 and is positioned closer to the first electrode 201 or the second electrode 202. The vacuum apparatus further includes an electrostatic elimination device 90. The electrostatic elimination device 90 can eliminate electrostatic adsorption between the substrate 60 and the first electrode 201 and/or between the substrate 60 and the second electrode 202 by attracting charged particles to a surface of the substrate 60 which is closer to a side the first electrode 201 and/or a surface of the substrate 60 which is closer to a side of the second electrode 202.

On this basis, the charged particles can neutralize the charges on the surface of the substrate 60, so that the electrostatic adsorption between the substrate 60 and the first electrode 201 and/or the second electrode 202 can be eliminated. In this way, substrate damages caused by electrostatic adsorption can be avoided when the substrate 60 is placed further from the first electrode 201 and/or the second electrode 202.

Figure 3:
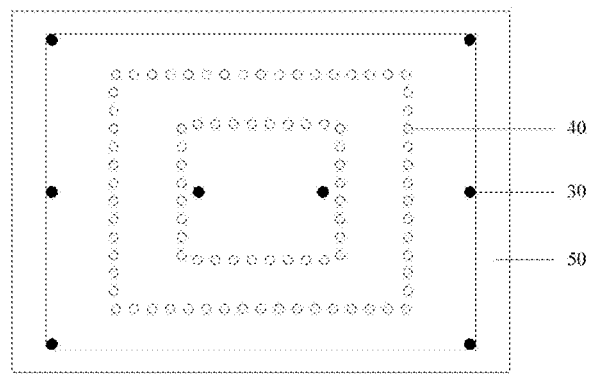
FIG. 3 is a top view of a vacuum apparatus provided by an embodiment of the present disclosure.

Based on the above description, preferably, referring to FIG. 1 and FIG. 3, the first electrode 201 and/or the second electrode 202 are provided with a plurality of gas holes 40 therein.

The gas holes 40 can be sequentially arranged in shape of annular arrays from outside to inside. On this basis, the gas hole 40 preferably is in shape of a pin hole with a very small diameter which can be smaller than 1 mm. It should be noted that the shape of the gas hole 40 is only schematically depicted; and the embodiment of the present disclosure is not limited by this, as long as it is in shape of thought hole with small diameter.

In this way, the gas holes 40 can be used as channels which can convey gaseous substances from the exterior of the vacuum cavity 10 to the interior of the vacuum cavity 10. Herein, the gaseous substances mainly refer to gas and plasma.

The actual number of the gas holes 40 of embodiments of the present disclosure is not limited herein. However, considering a balance problem of the substrate 60 when gas is conveyed to the substrate 60 through the gas holes 40, it is preferable in embodiments of the present disclosure that the gas holes 40 are symmetrically distributed relative to the first electrode 201 or the second electrode 202.

It should be noted that the positioning of the gas holes 40 is related to the positioning of the first electrode 201 and the second electrode 202. If the first electrode 201 and the second electrode 202 are disposed one above the other and there is only one substrate 60 in the vacuum cavity 10, then the gas holes 40 are only disposed in the lower electrode; if the first electrode 201 and the second electrode 202 are disposed side by side and there are two substrates 60 in the vacuum cavity 10, then the gas holes 40 can be disposed in both of the first electrode 201 and the second electrode 202.

Optionally, the vacuum apparatus further can include a gas conveying device 70 connecting with the vacuum cavity 10. The gas conveying device 70 can convey cooling gas at a constant pressure to the substrate 60 through the gas holes 40. The cooling gas is preferably chemically stable inert gas, such as helium or argon and the like.

Specifically, the gas conveying device 70 can be connected to a location of the cavity body of the vacuum cavity 10 near the gas holes 40. For example, when the gas holes 40 are disposed in the bottom electrode inside of the vacuum cavity 10, the gas conveying device 70 can be connected with the bottom of the vacuum cavity 10, so that cooling gas can be blown to the substrate 60 through the gas holes 40 in the bottom electrode.

It should be noted that the conveying way of cooling gas is constant pressure conveying; that is to say, the pressure applied to the substrate 60 by the cooling gas needs to be kept constant, and the pressures of the cooling gas conveying through different gas holes 40 should be consistent. Considering the cooling gas functions to reduce the temperature of the surface of the substrate 60, therefore, the pressure of the cooling gas should be kept within a certain range, so that the damages to the substrate 60 by excessive pressure can be avoided.

On this basis, the vacuum apparatus may further include a detection device 80 for detecting the pressure of the cooling gas.

Furthermore, referring to FIG. 1, FIG. 2 and FIG. 5, the vacuum apparatus may further comprises a barrier layer 50 disposed around the first electrode 201 and/or the second electrode 202; wherein the thickness of the barrier layer 50 is larger than the thickness of the first electrode 201 and/or the second electrode 202.

Therefore, during the process of conveying cooling gas at constant pressure to the substrate 60 through the gas holes 40, the provision of the barrier layer 50 can effectively prevent losing of the cooling gas so that the cooling gas can be kept between the substrate 60 and the first electrode 201 and/or between the substrate 60 and the second electrode 202 stably.

Beside, according to different functions of vacuum apparatuses, the vacuum cavity 10 can be a vacuum reaction cavity, that is, in operation, the vacuum cavity 10 needs to be fed with reactive gas, and in this case the vacuum apparatus may further include a gas inlet device for conveying reactive gas. Because the reactive gas needs to involve in reaction, the gas inlet device can be connected to the middle location of the cavity body of the vacuum cavity 10, that is to say, located between the first electrode 201 and the second electrode 202, so that the reactive gas can be fed between the first electrode 201 and the second electrode 202 to react.

Optionally, the electrostatic elimination device 90 may comprise a plasma discharging system 901 and a plasma conveying system 902. The electrostatic elimination device 90 may convey plasma to the surface of the substrate closer to a side of the first electrode 201 or the surface of the substrate 60 closer to a side of the second electrode 202.

Herein, the plasma discharging system 901 can be used to produce plasma, while the plasma conveying system 902 can be used to convey plasma.

In detail, the plasma can be derived from outside of the vacuum cavity 10, or alternatively can be derived from inside of the vacuum cavity 10. It should be noted that when the plasma is derived from outside of the vacuum cavity 10, an additional plasma-generating device is needed outside the vacuum cavity 10, such as plasma generator; when the plasma is derived from inside of the vacuum cavity 10, the vacuum cavity 10 needs to be a vacuum cavity that can generate plasma, such as a vacuum cavity of a dry etching apparatus.

On this basis, the plasma discharging system 901 may include an anode and a cathode for generating plasma. The plasma conveying system 902 might include a vacuum pump 9021 and a conveying conduit 9022.

The cathode and the anode can be metal electrodes. The conveying conduit 9022 can be a conduit of insulating material, such as rubber or resin.

Furthermore, in the case that plasma is generated inside the vacuum cavity 10, the anode is preferably the first electrode 201; the cathode is preferably the second electrode 202. At this time, first connecting port(s) 1010 and second connecting port(s) 1020 are provided between the plasma conveying system 902 and the vacuum cavity 10. The first connecting port 1010 is used to lead the plasma generated within the vacuum cavity 10 outside the vacuum cavity 10, and the second connecting port 1020 is used to convey plasma to the substrate 60 through the gas holes 40.

It should be noted that the first connecting port 1010 and the second connecting port 1020 are differentiated by functions of the connecting ports. However, the number of the first connecting port(s) 1010 and the second connecting port(s) 1020 can be determined based on specific situation. Specifically, when only one substrate 60 is placed in the vacuum cavity 10, either the number of the first connecting port 1010 or the number of the second connecting port 1020 can be one. When two substrates 60 are disposed in the vacuum cavity 10, either the number of the first connecting port(s) 1010 or the number of the second connecting port(s) 1020 can be two.

Considering when electrostatic adsorption occurs between the substrate 60 and the first electrode 201 and/or between the substrate 60 and the second electrode 202, according to the different position of the substrate 60, the polarity of the charges on the surface of the substrate 60 can be different. In order to neutralize charges effectively, the first connecting port 1010 is preferably arranged near an electrode with a polarity opposite to the polarity of the charges on the substrate 60. On this basis, if two substrates 60 are placed in the vacuum cavity 10 at the same time, and one is closer to the first electrode 201, the other is closer to the second electrode 202, the polarities of charges on the surfaces of the two substrates 60 are different, then the first connecting port(s) 1010 needs to be connected with the vacuum cavity 10 at different positions.

Based on the above description, when the anode and the cathode in the plasma discharging system 901 are the first electrode 201 and the second electrode 202, the plasma generated in the vacuum cavity 10 can be applied to the electrostatic elimination device 90 as an ion source.

On this basis, the conveying conduit 9022 may further include an branch leading to the outside of the vacuum cavity 10, therefore, the vacuum pump 9021 and the conveying conduit 9022 can be used to effectively drain plasma and other substances out of the interior of the vacuum cavity 10, so that the vacuum degree of the vacuum cavity 10 can be ensured.

Preferably, the first electrode 201 is located at top of the vacuum cavity 10, and the second electrode 202 is located at the bottom of the second electrode 202. The substrate 60 is located above the second electrode 202 and is placed near the second electrode 202.

In this case, the gas holes 40 can only be provided in the second electrode 202 and the conveying conduit 9022 can be connected from the middle of the cavity body of the vacuum cavity 10 to the bottom of the vacuum cavity 10, so that the plasma generated in the vacuum cavity 10 can flow through the gas holes 40 towards the surface of the substrate 60 smoothly.

In this process, the plasma can pass through the gas holes 40 from outside to inside to convey to the surface of the substrate 60. That is to say, the gas holes 40 located at the outer portion can first release the plasma, while gas holes 40 located at the inner portion can subsequently release the plasma, and so on. In this way, the plasma can pass through the gas holes 40 from outside to inside to reach the surface of the substrate 60, so that the effect of eliminating electrostatic adsorption can be achieved. Therefore, the substrate 60 can be placed on the second electrode 202 naturally.

On this basis, the positioning structures 30 can be supporting pins. The supporting pins can have the function of lifting and lowering. By lifting the support pins, the substrate 60 can be raised away from the second electrode 202. Because the electrostatic adsorption between the substrate 60 and the second electrode 202 can be eliminated, there is no possibility of damaging the substrate 60 during lifting. In this case, the second electrode 202 further has pin holes therein matching the supporting pins.

The following is an embodiment to illustrate the function of eliminating electrostatics of the vacuum apparatus. The vacuum apparatus is for instance a plasma dry etching apparatus.

Figure 4:
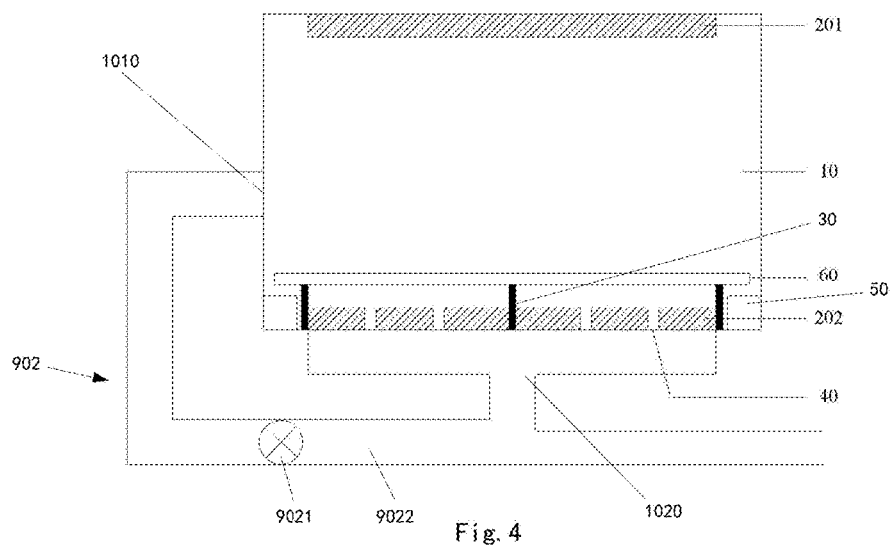
FIG. 4 is a third schematic view showing the structure of a vacuum apparatus provided by an embodiment of the present disclosure.

As shown in FIG. 4, the plasma dry etching apparatus includes a first electrode 201 at the top of the vacuum cavity 10 and a second electrode 202 at the bottom of the vacuum cavity 10. The second electrode 202 is provided with a plurality of gas holes 40 and pin holes through which a plurality of symmetrically distributed supporting pins (positioning structure 30) can pass and can be lifted or lowered. A barrier layer 50 is disposed around the second electrode 202. The thickness of the barrier layer 50 is somewhat larger than the thickness of the second electrode 202.

On this basis, the plasma dry etching apparatus further comprises: a gas inlet device for conveying reactive gas; a gas conveying device 70 for conveying cooling gas; and a plasma conveying system 902 for connecting the middle of the cavity body of the vacuum cavity 10 and the bottom of the vacuum cavity 10. Both of the gas conveying device 70 and the plasma conveying system 902 can be connected with the gas holes in the second electrode 202.

In this way, during operation of the plasma dry etching apparatus, the substrate 60 needing to be plasma dry etched can be placed on the supporting pins and is adjusted to the position aligned with the barrier layer 50. As the plasma dry etching begins, a certain voltage is applied between the first electrode 201 and the second electrode 202. At meantime, the gas inlet device is conveying reactive gas such as oxygen into the vacuum cavity 10 and the gas conveying device 70 is conveying cooling gas such as helium to the back face of the substrate 60 through the gas holes 40 in the second electrode 202. Under the action of a high voltage electric field, the reactive gas can be highly ionized so that oxygen plasma can be formed. On this basis, on one hand, part of the oxygen plasma in the vacuum cavity 10 is used to dry etch the substrate 60; on the other hand, in order to ensure the vacuum degree of the cavity body, the gas, plasma and impurity particles in the cavity need to be discharged in time. At this time, the vacuum pump 9021 in the plasma conveying system 902 can be used to pump them out, and discharge most of them from the vacuum cavity 10 through a branch of the conveying conduit 9022. When the plasma dry etching is about to be finished, the pumped plasma can further be led to the gas holes 40 in the second electrode 202 through the conveying conduit 9022, and is conveyed to the surface of the substrate 60 through gas holes 40 to neutralize charges on the surface of the substrate 60, thereby eliminating the electrostatic adsorption.

The embodiment of the present disclosure can neutralize charges on surface of the substrate 60 with plasma generated by the plasma dry etching apparatus itself, eliminating the electrostatic adsorption between the substrate 60 and the second electrode 202 so that the damages to the substrate caused by the electrostatic adsorption can be avoided. At the same time, the plasma generated within the vacuum cavity can be effectively utilized. This embodiment is easy and simple to practice.

Furthermore, the above embodiment is taking a plasma dry etching apparatus as an example; however, the present disclosure is not limited by this. The vacuum apparatus can be any other vacuum apparatus with electrostatic adsorption phenomenon, such as a vapor deposition apparatus which will not be described in more detail.

The above description is only embodiment of the present disclosure. However, the protection scope of the present disclosure is not limited by this. Those skilled in the art can easily envision variations or alternations to the embodiment within the technical scope of the present disclosure and those variations or alternations are within the protection scope of the present disclosure. Therefore, the protection scope of the present disclosure is only based on the protection scope of the claims.

The invention claimed is:

1. A vacuum apparatus, comprising:
    a vacuum cavity having a body including a top, sidewalls and a bottom;
    a first electrode and a second electrode both located inside the vacuum cavity and opposite to each other;
    at least one positioning element for positioning a substrate arranged between the first electrode and the second electrode; and
    an electrostatic elimination assembly,
    wherein the substrate is positioned closer to the first electrode or the second electrode, and the electrostatic elimination assembly can eliminate an electrostatic adsorption between the substrate and the electrode that is closer to the substrate by attracting charged particles to a surface of the substrate which is facing the closer electrode, and
    wherein the closer electrode is provided with a plurality of gas holes, the electrostatic elimination assembly comprises a plasma discharging system and a plasma conveying system, the plasma discharging system comprises an anode and a cathode used to generate the plasma, the anode is the first electrode, the cathode is the second electrode, the plasma conveying system comprises a conveying conduit disposed outside the vacuum cavity and which is connected from a middle of one of the sidewalls of the vacuum cavity to the bottom of the vacuum cavity, so that the plasma generated in the vacuum cavity can flow through the gas holes towards the surface of the substrate which is facing the closer electrode.

2. The vacuum apparatus according to claim 1, wherein the vacuum apparatus further comprises a gas conveying device which is in connection with the vacuum cavity, the gas conveying device conveys cooling gas at a constant pressure to the substrate through the gas holes, the cooling gas is inert gas.

3. The vacuum apparatus according to claim 2, wherein the vacuum apparatus further comprises a detection device for detecting pressure of the cooling gas.

4. The vacuum apparatus according to claim 1, wherein a first connecting port and a second connecting port are provided between the plasma conveying system and the vacuum cavity, the first connecting port is used to lead plasma generated inside the vacuum cavity outside the vacuum cavity, and the second connecting port is used to convey plasma to the substrate through the gas holes.

5. The vacuum apparatus according to claim 1, wherein the first electrode is positioned at the top of the vacuum cavity, the second electrode is positioned at the bottom of the vacuum cavity; and the substrate is positioned over the second electrode and near the second electrode.

6. The vacuum apparatus according to claim 5, wherein the positioning elements are supporting pins, the second electrode is provided with pin holes matching the supporting pins.

7. The vacuum apparatus according to claim 1, wherein the vacuum apparatus further comprises a barrier layer disposed around the first electrode and/or the second electrode, the thickness of the barrier layer is larger than the thickness of the first electrode and/or the second electrode.

* * * * *